(12) United States Patent
Huang et al.

(10) Patent No.: US 9,779,989 B1
(45) Date of Patent: Oct. 3, 2017

(54) METHOD FOR MANUFACTURING METAL INTERCONNECTS

(71) Applicant: UNITED MICROELECTRONICS CORP., Hsin-Chu (TW)

(72) Inventors: Po-Cheng Huang, Kaohsiung (TW); Chun-Liang Liu, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/168,095

(22) Filed: May 30, 2016

(51) Int. Cl.
*H01L 21/00* (2006.01)
*H01L 21/768* (2006.01)

(52) U.S. Cl.
CPC .... *H01L 21/76879* (2013.01); *H01L 21/7684* (2013.01); *H01L 21/76802* (2013.01); *H01L 21/76843* (2013.01); *H01L 21/76862* (2013.01); *H01L 21/76873* (2013.01)

(58) Field of Classification Search
CPC .................................................. H01L 21/76879
See application file for complete search history.

(56) References Cited

U.S. PATENT DOCUMENTS

| 6,225,226 B1 * | 5/2001 | Lee ................... H01L 21/76843 216/18 |
| 6,319,728 B1 * | 11/2001 | Bhan ........................ C23C 16/18 257/E21.591 |
| 6,335,283 B1 | 1/2002 | Ngo et al. |

* cited by examiner

*Primary Examiner* — William Harriston
(74) *Attorney, Agent, or Firm* — Winston Hsu

(57) ABSTRACT

A method for manufacturing metal interconnects. The method includes following steps. A substrate including a dielectric layer formed thereon is provided, and a plurality of trenches are formed in the dielectric layer. Next, a seed layer is formed in the trenches and on the dielectric layer and followed by masking regions of the seed layer to define a plurality of masked regions and a plurality of exposed regions for the seed layer. Subsequently, a surface treatment is performed to the exposed regions of the seed layer to form a plurality of rough surfaces on the exposed regions of the seed layer. Then, a metal layer is formed on the substrate, and the trenches are filled up with the metal layer.

20 Claims, 9 Drawing Sheets

METHOD FOR MANUFACTURING METAL INTERCONNECTS

BACKGROUND OF THE INVENTION

1. Field of the Invention

The present invention relates generally to a method for manufacturing metal interconnects, and more particularly, to a method for manufacturing metal interconnects capable of reducing dishing effect.

2. Description of the Prior Art

In the fabrication of semiconductor integrated circuits (ICs), semiconductor devices are generally connected by several metallic interconnecting layers commonly referred to as multi-level interconnects, and damascene process has been deemed a convenient and predominant method for forming the multi-level interconnects. Principally, the damascene process includes etching a dielectric material layer to form trench and/or via hole patterns, filling the patterns with conductive materials such as copper, and performing a planarization process. Thus metal interconnects are obtained.

Chemical mechanical planarization, or chemical mechanical polishing (hereinafter abbreviated as CMP), is a common technique used in the planarization process. Those skilled in the art have well known that the topography and pattern densities of the surface being polished influence CMP result greatly. When planarizing structures comprised of different film layers using CMP, it is desirable for the final structure to exhibit coplanarity with respect to each film. However, "dishing", which is the formation of topographical defects, such as concavities or depressions, in the copper and copper alloy layer of features formed on the substrate surface, is often found. Dishing issue further results in a non-planar surface that impairs the ability to print high resolution lines during subsequent photolithographic steps and detrimentally affects subsequent surface topography of the substrate and device/line formation. Furthermore, dishing issue also detrimentally affects the performance of devices by lowering the conductance and increasing the resistance of the devices, contrary to the benefit of using higher conductive materials, such as copper.

Since CMP process is one accepted method of planarization and now typically employed in the industry, it is always in need to solve the inferior evenness and to diminish dishing issue.

SUMMARY OF THE INVENTION

According to an aspect of the present invention, there is provided a method for manufacturing metal interconnects. The method includes following steps. A substrate including a dielectric layer formed thereon is provided, and a plurality of trenches are formed in the dielectric layer. Next, a seed layer is formed in the trenches and on the dielectric layer and followed by masking regions of the seed layer to define a plurality of masked regions and a plurality of exposed regions for the seed layer. Subsequently, a surface treatment is performed to the exposed regions of the seed layer to form a plurality of rough surfaces on the exposed regions of the seed layer. Then, a metal layer is formed on the substrate, and the trenches are filled up with the metal layer.

According to another aspect of the present invention, there is provided a method for manufacturing metal interconnects. The method includes following steps. A substrate including a dielectric layer formed thereon is provided, and a plurality of trenches are formed in the dielectric layer. Then, the trenches are masked to define a plurality of exposed regions on the dielectric layer. A surface treatment is subsequently performed to the exposed regions to form a plurality of rough surfaces on the exposed regions and followed by forming a seed layer on the substrate. The seed layer includes a plurality of rough surfaces respectively on the exposed regions. Next, a metal layer is formed on the substrate, and the trenches are filled up with the metal layer.

According to the methods for manufacturing the metal interconnects provided by the present invention, the surface treatment is performed before or after forming the seed layer such that the seed layer obtains rough surfaces on certain regions that are defined outside of the trenches. More important, portions of the metal layer formed on the rough surfaces of the seed layer inherently obtain inferior quality. Accordingly, removal of those portions of the metal layer is facilitated. Thus, when the point is reached that all conductive material outside the trenches has been removed, the trenches are found to be just filled with a flat layer that has no dishing.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIG. 7 is a schematic drawing in a step subsequent to FIG. 6, and FIG. 8 is a schematic drawing in a step subsequent to FIG. 7.

FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

FIG. 15 is a schematic drawing in a step subsequent to FIG. 14, FIG. 16 is a schematic drawing in a step subsequent to FIG. 15, and FIG. 17 is a schematic drawing in a step subsequent to FIG. 16.

DETAILED DESCRIPTION

Figure 1:
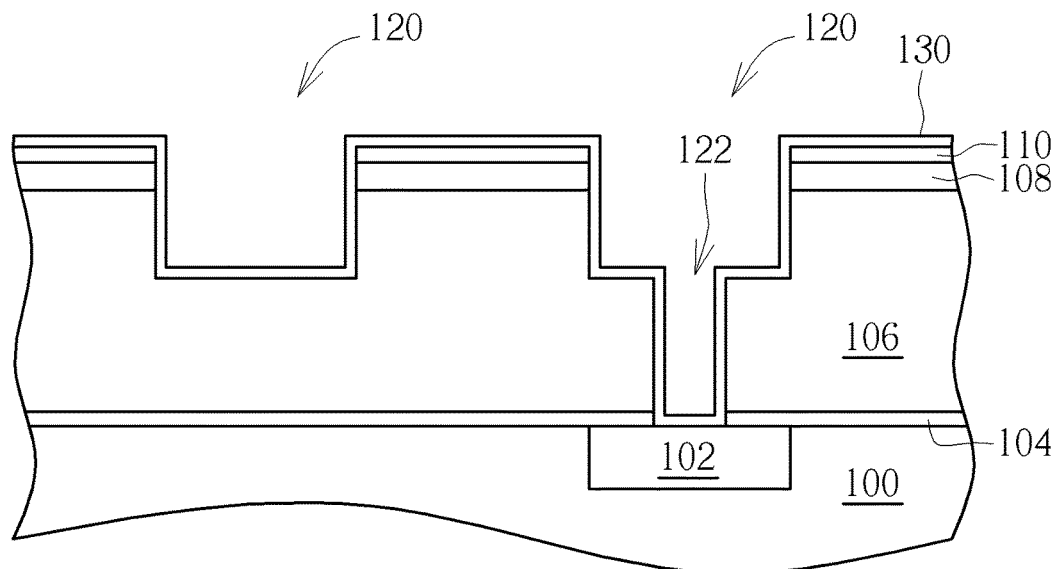
FIGS. 1-5 are schematic drawings illustrating a method for manufacturing metal interconnects provided by a first preferred embodiment of the present invention.

Please refer to FIGS. 1-5, which are schematic drawings illustrating a method for manufacturing metal interconnects provided by a first preferred embodiment of the present invention. As shown in FIG. 1, the preferred embodiment first provides a substrate 100, such as a silicon substrate, silicon-containing substrate, or silicon-on-insulator (SOI) substrate. The substrate 100 includes a conductive layer 102 and a base layer 104 covering the conductive layer 102. In the preferred embodiment, the conductive layer 102 includes metal material and the base layer 104 includes, for example but not limited to, nitrogen-doped silicon carbide. Furthermore, the substrate 100 includes a dielectric layer 106 covering the base layer 104 as shown in FIG. 1. The dielectric layer 106 can include low dielectric constant (K) (i.e. K value lower than 3.9) material, ultra low-k (ULK) (i.e. K value lower than 2.6) material, or porous ULK material. It is well-known that the low-K material, the ULK material and the porous ULK material are not dense materials and has weak structure strength, therefore, a dense cap layer 108 is exemplarily formed on the dielectric layer 106 in some embodiments of the present invention. The cap layer 108 can be a single-layered structure including silicon oxide (SiO), silicon oxynitride (SiON) or tetraethylorthosilicate (TEOS) as shown in FIG. 1. Alternatively, the cap layer 108 also can be a multi-layered structure. A patterned metal hard mask 110 is formed on the cap layer 108. The patterned metal hard mask 110 can be a single-layered structure or a multi-layered structured. The patterned metal hard mask 110 includes materials selected from the group consisting of titanium (Ti), titanium nitride (TiN), tantalum (Ta), and tantalum nitride (TaN). For example, the patterned metal hard mask 110 provided by the preferred embodiment can be a multi-layered structure including Ti/TiN or Ta/TaN, but not limited to this. In some embodiments of the preset invention, an anti-reflective coating (hereinafter abbreviated as ARC) layer (not shown) is selectively formed on the patterned metal hard mask 110. The ARC can include SiON or TEOS, but not limited to this. A plurality of trenches 120 are formed in the dielectric layer 106. In some embodiments of the present invention, at least a via hole 122 is further formed in the dielectric layer 106 under one of the trenches 120 as shown in FIG. 1. Furthermore, the conductive layer 102 is exposed at a bottom of the via hole 122 as shown in FIG. 1.

Please still refer to FIG. 1. Next, the via hole 122 and the trenches 120 are lined with a diffusion barrier layer 130. That is, bottoms and sidewalls of the via hole 122 and of the trenches 120 are covered by the diffusion barrier layer 130. The diffusion barrier layer 130 can include titanium (Ti), titanium nitride (TiN), tantalum (Ta), tantalum nitride (TaN), or other alternatives, but not limited to this. The diffusion barrier layer 130 can be deposited by any suitable process. A suitable process can be a chemical vapor deposition (hereinafter abbreviated as CVD) method, an atomic layer deposition (ALD), or a physical vapor deposition (hereinafter abbreviated as PVD). In some embodiments of the present invention, a thickness of the diffusion barrier layer 130 is between 20 angstroms (Å) and 200 Å, but not limited to this.

Figure 2:
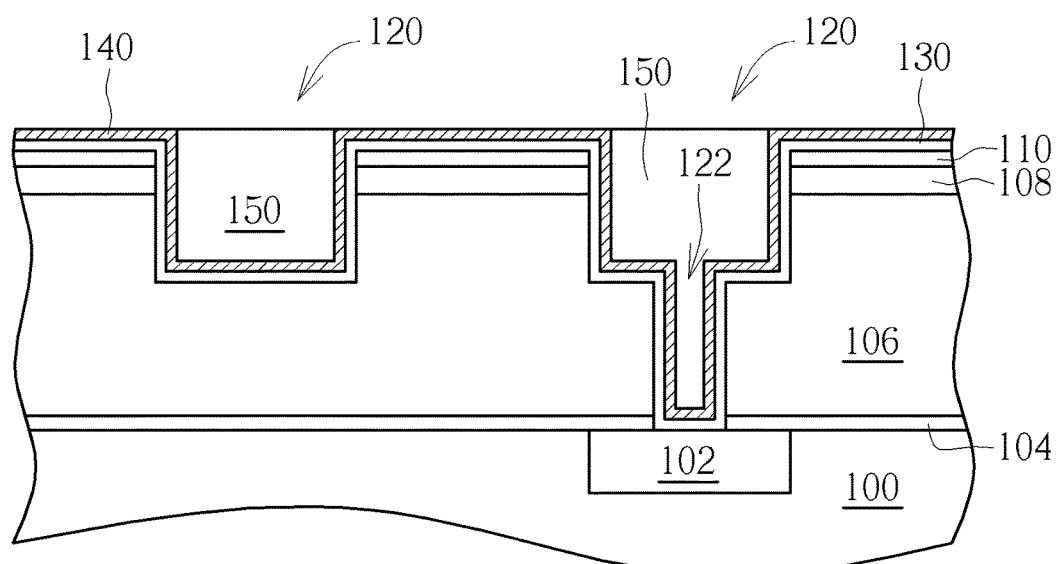

Please refer to FIG. 2. Next, a seed layer 140, such as copper (Cu) seed layer 140 is formed on the diffusion barrier layer 130 in the trenches 120 and the via hole 122 and on the dielectric layer 106. As shown in FIG. 2, the trenches 120 and the via hole 122 are lined with the seed layer 140. The seed layer 140 can be formed by any suitable process, and a suitable process can be, for example but not limited to, a PVD. In some embodiments of the present invention, sputtering and ionized PVD (iPVD) can be used. A thickness of the seed layer 140 is between 170 Å and 200 Å, but not limited to this. Please still refer to FIG. 2. After forming the seed layer 140, a sacrificial layer 150 is respectively formed in the trenches 120 and the via hole 122 as shown in FIG. 2. In some embodiments of the present invention, the sacrificial layer 150 can be a photoresist, but not limited to this. It is noteworthy that, the trenches 120 and the via hole 122 are filled up with the sacrificial layer 150, and thus the seed layer 140 on the sidewalls and the bottoms of the trenches 120 and the via hole 122 are covered by the sacrificial layer 150 while portions of the seed layer 140 that are on the top surface of the dielectric layer 106 are exposed as shown in FIG. 2.

Figure 3:
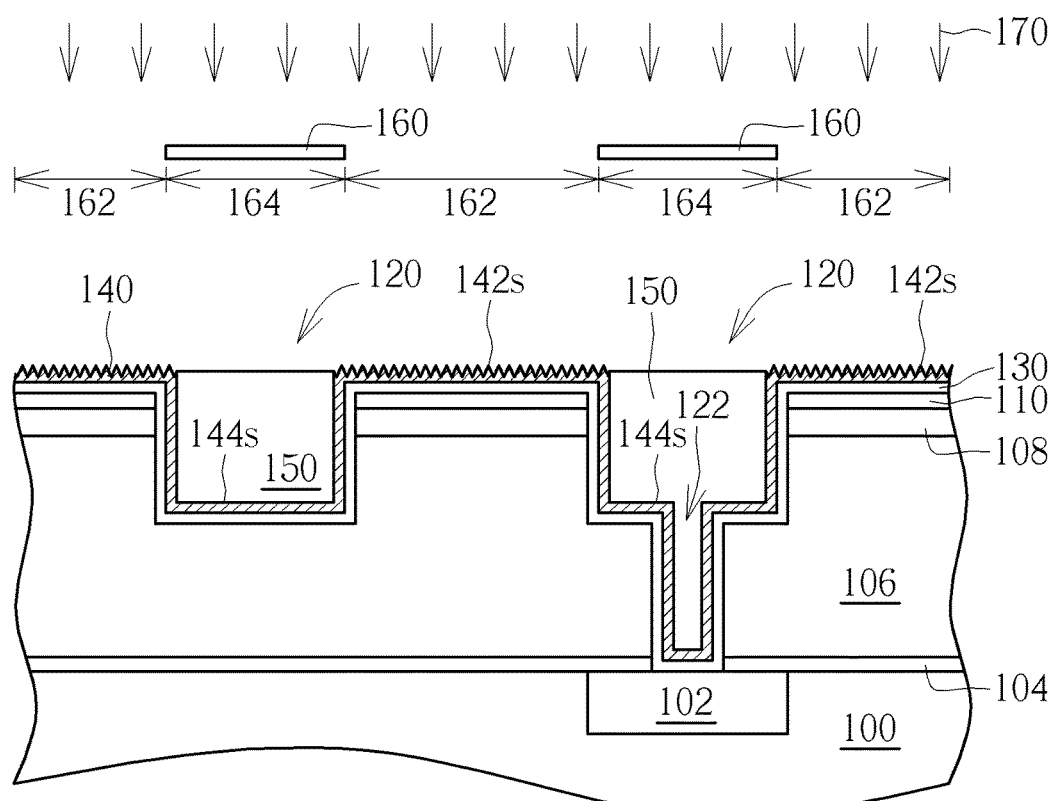

Please refer to FIG. 3. After forming the seed layer 140, the seed layer 140 is masked by, for example but not limited to, a mask 160. Accordingly, regions of the seed layer 140 not being masked are defined as exposed regions 162 while regions being masked are defined as masked regions 164. Next, a surface treatment 170 is performed to the exposed regions 162 of the seed layer 140. In the preferred embodiment, the surface treatment 170 includes an ion bombardment, and the ion bombardment includes producing nitrogen (N), boron (B), arsenic (As), phosphorous (P), inert, or halogen ions. It is noteworthy that in some embodiments of the present invention, the ion bombardment provides N, B, As P, or inert ions with higher bias, compared with other embodiments of the present invention that the ion bombardment provides halogen ions with lower bias. It should be understood to those skilled in the art that the above mentioned higher and lower bias can be controlled by power source. For example but not limited to, the halogen ions are provided with a lower bias in a range from 10V to 100V while N, B, As P, or inert ions are provided with a higher bias larger than 100V.

More important, the surface treatment 170, that is the ion bombardment, is performed to damage surfaces of the exposed region 162 of the seed layer 140, and thus a plurality of rough surfaces 142s on the exposed regions 162 of the seed layer 140 are obtained. It is noteworthy that the masked regions 164 of the seed layer 140 are masked by the mask 160 and protected by the sacrificial layer 150, and thus no impact is rendered to the masked regions 164. Consequently, the masked regions 164 respectively include a smooth surface 144s compared with the rough surfaces 142s of the exposed regions 162.

Figure 4:
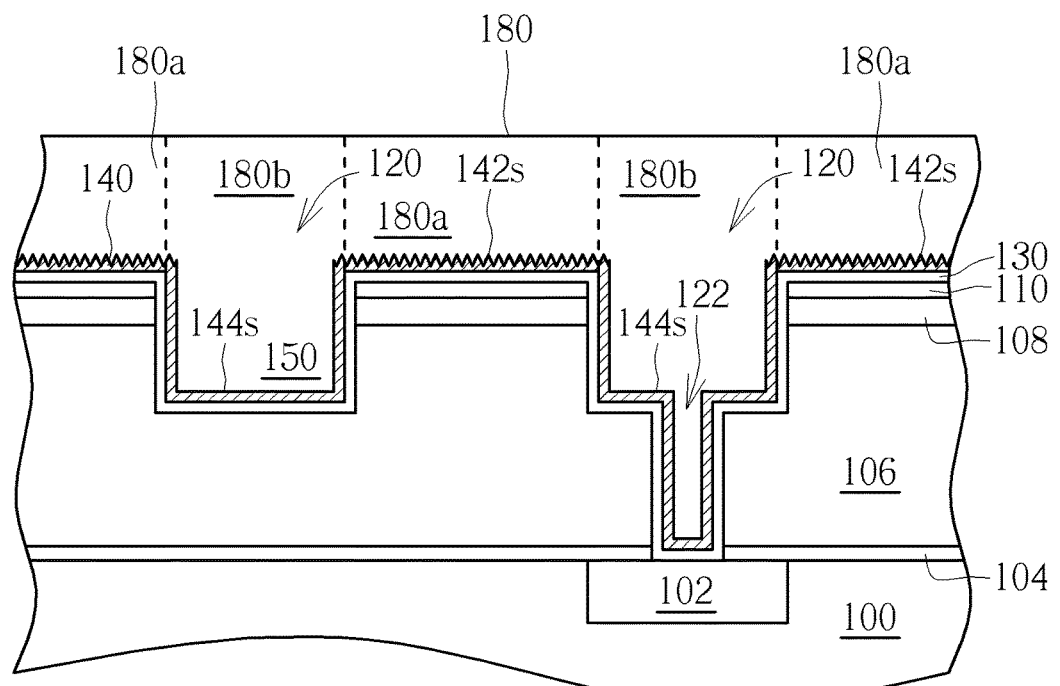

Please refer to FIG. 4. After forming the rough surfaces 142s, the mask 160 and the sacrificial layer 150 are removed. A metal layer 180 such as a Cu layer 180 is formed on the substrate 100, and the trenches 120 and the via hole 122 are filled up with the Cu layer 180. In some embodiments of the present invention, the Cu layer 180 is deposited on the substrate 100 such that the seed layer 140 and the Cu layer 180 are merged. In other embodiments of the present invention, the Cu layer 180 is deposited using an electroplated mode with the seed layer 140 serving as an electrode. In still other embodiments of the present invention, a CVD processing in conjunction with PVD can be used to form the Cu layer 180. However, in either process for forming the Cu layer 180, the quality of the seed layer 140 greatly affects the quality of the Cu layer 180. Consequently, portions 180a of the Cu layer 180 formed on the rough surfaces 142s inherently obtain an inferior quality compared with the other portions 180b of the Cu layer 180 formed on the smooth surfaces 144s.

Figure 5:
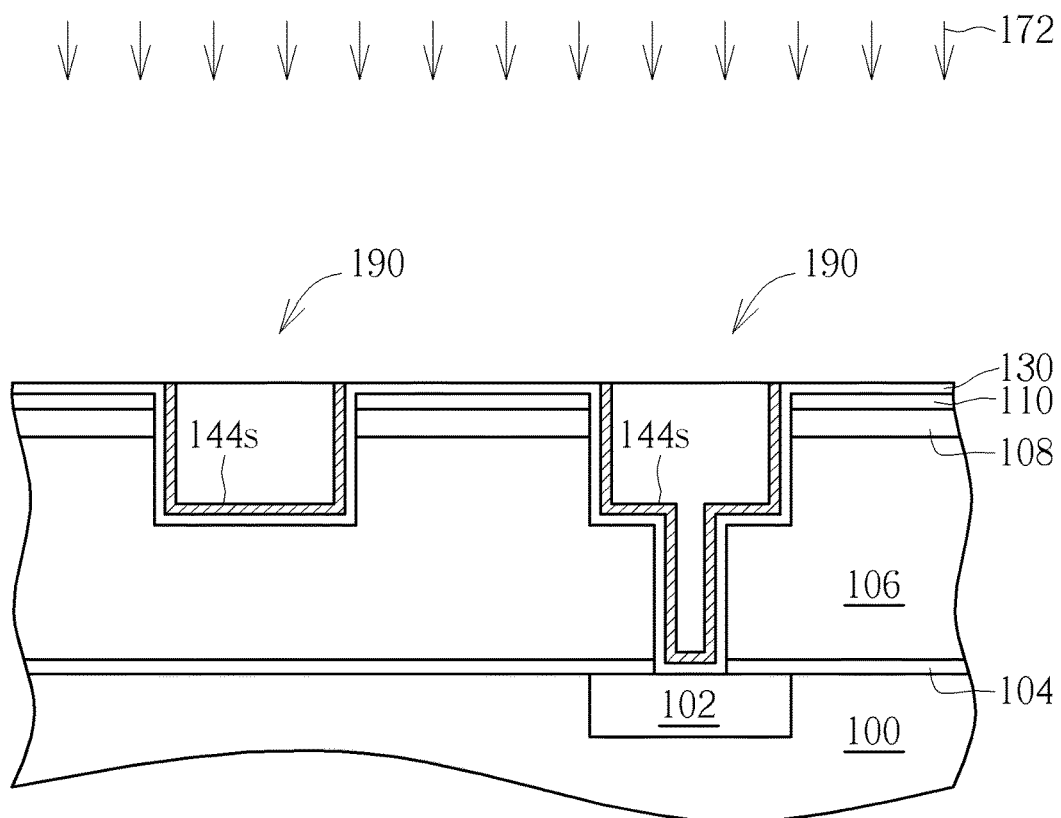

Please refer to FIG. 5. After filling the trenches 120 and the via hole 122 with the metal layer 180, a planarization process 172 is performed to remove superfluous metal layer 180 and seed layer 140 from the substrate 100 to form a plurality of metal interconnects 190 on the substrate 100. It is noteworthy that the planarization process 172 is performed to remove the superfluous metal layer 180 and seed layer 140 until the diffusion barrier layer 130 is exposed. It is found that for exposing the diffusion barrier layer, dishing is always caused in top surfaces of the metal interconnects, and the dishing issue renders adverse impact to the final product as mentioned above. However, the metal layer 180 provided by the preferred embodiment includes the portions 180a having inferior quality due to the rough surfaces 142s of the seed layer 140 on which it is formed. And removal of the portions 180a of the metal layer 180, which are formed correspondingly outside of the trenches 120, is facilitated due to its inferior quality. Thus, when the point is reached that all metal layer 180 outside the trenches 120 has been removed, the trenches 120 are found to be just filled with a flat layer that has no dishing as shown in FIG. 5. Additionally, those skilled in the art would easily realize that the diffusion barrier layer 130 exposed on patterned metal hard mask 110 is to be removed.

According to the method for manufacturing the metal interconnects provided by the preferred embodiment, the surface treatment 170 is performed after forming the seed layer 140, therefore the seed layer 140 obtains the rough surfaces 142s. Consequently, the portions 180a of the metal layer 180 formed on the rough surfaces 142s, which are correspondingly formed outside of the trenches 120, inherently obtain the inferior quality and thus are more easily to be removed. As mentioned above, when the point is reached that the metal layer 180 outside the trenches 120 has been removed, the trenches 120 are found to be just filled with a flat layer and the resulted metal interconnects 190 have no dishing issue.

Figure 6:
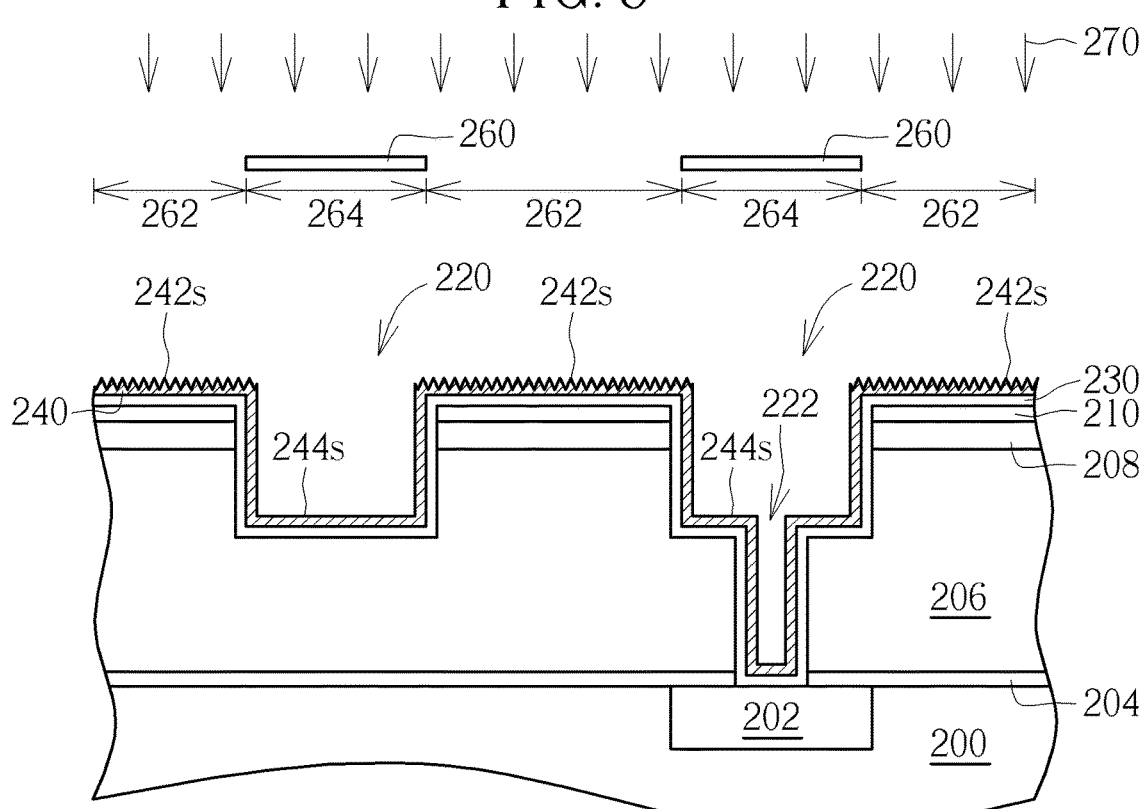
FIGS. 6-8 are schematic drawings illustrating a method for manufacturing metal interconnects provided by a second preferred embodiment of the present invention.
Figure 7:
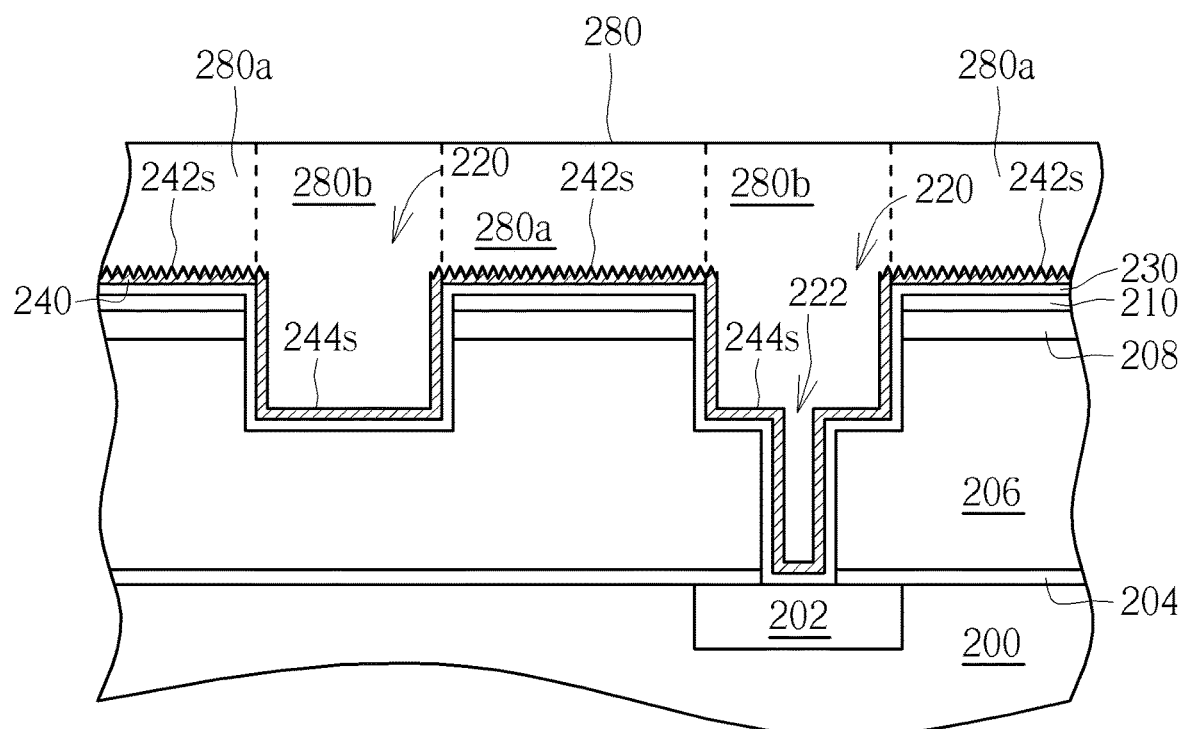
Figure 8:
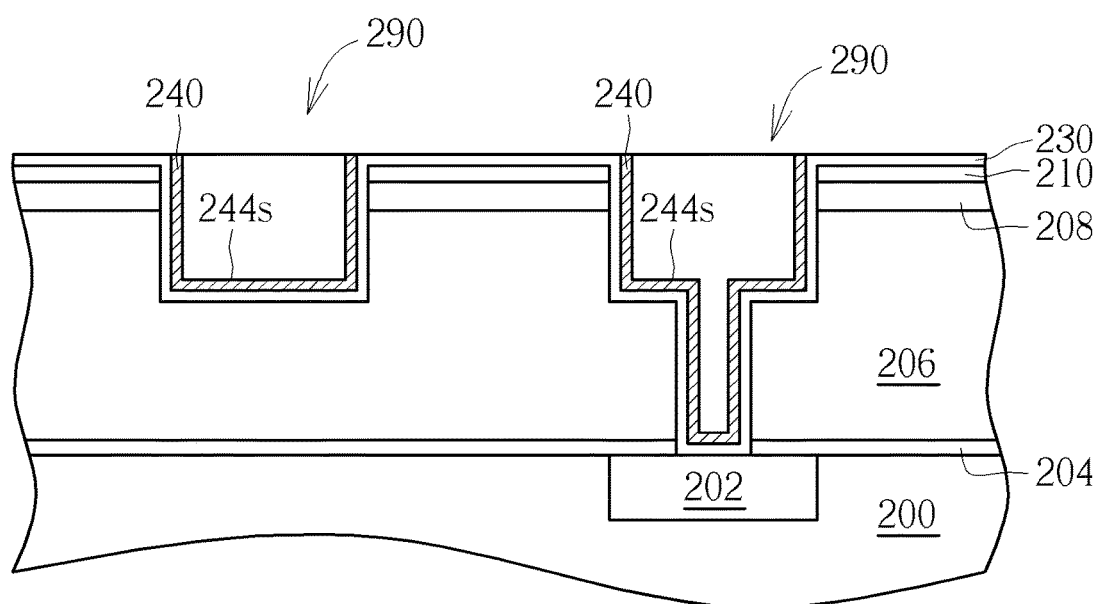

Please refer to FIG. 6-8, which are schematic drawings illustrating a method for manufacturing metal interconnects provided by a second preferred embodiment of the present invention. It should be noted that elements the same in the first and second preferred embodiments can include the same material and thus those details are omitted in the interest of brevity. As shown in FIG. 6, the preferred embodiment first provides a substrate 200. The substrate 200 includes a conductive layer 202 formed therein, and a base layer 204 is formed to cover the conductive layer 202. The substrate 200 further includes a dielectric layer 206 formed thereon. A cap layer 208 and a patterned metal hard mask 210 are formed on the dielectric layer 206 as shown in FIG. 6. In some embodiments of the preset invention, an ARC layer (not shown) is selectively formed on the patterned metal hard mask 210. A plurality of trenches 220 are formed in the dielectric layer 206. In some embodiments of the present invention, at least a via hole 222 is further formed in the dielectric layer 206 under one of the trenches 220 as shown in FIG. 6. Furthermore, the conductive layer 202 is exposed at a bottom of the via hole 222 as shown in FIG. 6.

Please still refer to FIG. 6. Next, the via hole 222 and the trenches 220 are lined with a diffusion barrier layer 230. That is, bottoms and sidewalls of the via hole 222 and of the trenches 220 are covered by the diffusion barrier layer 230. In some embodiments of the present invention, a thickness of the diffusion barrier layer 230 is between 20 Å, and 200 Å, but not limited to this. Subsequently, a seed layer 240, such as Cu seed layer 240 is formed on the diffusion barrier layer 230 in the trenches 220 and the via hole 222. As shown in FIG. 6, the trenches 220 and the via hole 222 are lined with the seed layer 240. A thickness of the seed layer 240 is between 170 Å and 200 Å, but not limited to this.

Please still refer to FIG. 6. After forming the seed layer 240, the substrate 200/the seed layer 240 is masked by, for example but not limited to, a photomask 260. Accordingly, regions of the seed layer 240 not being masked are defined as exposed regions 262 while regions of the seed layer 240 being masked are defined as masked regions 264. Please still refer to FIG. 6. Next, a surface treatment 270 is performed to the exposed regions 262 of the seed layer 240. In the preferred embodiment, the surface treatment 270 includes an exposure, and the exposure includes Laser or UV. In other words, the substrate 200 is exposed to Laser or UV with the photomask 260 intervening between the light source and the substrate 200.

More important, the exposed regions 262 are exposed to Laser or UV and thus galvanic corrosion is caused. Consequently, surfaces of the exposed regions 262 are damaged, and thus a plurality of rough surfaces 242s on the exposed regions 262 of the seed layer 240 are obtained. It is noteworthy that the masked regions 264 of the seed layer 240 are masked by the photomask 260 and thus protected from the surface treatment 270. Consequently, no impact is rendered to the masked regions 264. As a result, the masked regions 264 respectively include a smooth surface 244s compared with the rough surfaces 242s of the exposed regions 262.

Please refer to FIG. 7. After forming the rough surfaces 242s, the photomask 260 is removed. A metal layer 280 such as a Cu layer 280 is then formed, and the trenches 220 and the via hole 222 are filled up with the Cu layer 280. It is well-known to those skilled in the art that the quality of the seed layer 240 greatly affects the quality of the Cu layer 280. Consequently, portions 280a of the Cu layer 280 formed on the rough surfaces 242s inherently obtain an inferior quality compared with the other portions 280b of the Cu layer 280 formed on the smooth surfaces 244s.

Please refer to FIG. 8. After filling the trenches 220 and the via hole 222 with the metal layer 280, a planarization process 272 is performed to remove superfluous metal layer 280 and seed layer 240 from the substrate 200 to form a plurality of metal interconnects 290 on the substrate 200. It is noteworthy that the planarization process 272 is performed to remove the superfluous metal layer 280 and seed layer 240 until the diffusion barrier layer 230 is exposed. As mentioned above, for exposing the diffusion barrier layer, dishing is always caused in top surfaces of the metal interconnects in the prior art. However, the metal layer 280 provided by the preferred embodiment includes portions 280a having an inferior quality due to the rough surfaces 242s of the seed layer 240 on which it is formed. And removal of the portions 280a of the metal layer 280, which are formed correspondingly outside of the trenches 220, is facilitated due to its inferior quality. Thus, when the point is reached that all metal layer 280 outside the trenches 220 has been removed, the trenches 220 are found to be just filled with a flat layer that has no dishing as shown in FIG. 8. Additionally, those skilled in the art would easily realize that the diffusion barrier layer 230 exposed on patterned metal hard mask 210 is to be removed.

According to the method for manufacturing the metal interconnects provided by the preferred embodiment, the surface treatment 260 is also performed after forming the seed layer 240 and the rough surfaces 242s are obtained without requiring any sacrificial layer. Consequently, the portions 280a of the metal layer 280 formed on the rough surfaces 242s, which are correspondingly defined outside of the trenches 220, inherently obtain the inferior quality and thus are more easily to be removed. As mentioned above, when the point is reached that the metal layer 280 outside the trenches 220 has been removed, the trenches 220 are found to be just filled with a flat layer and the resulted metal interconnects 290 have no dishing issue.

Figure 9:
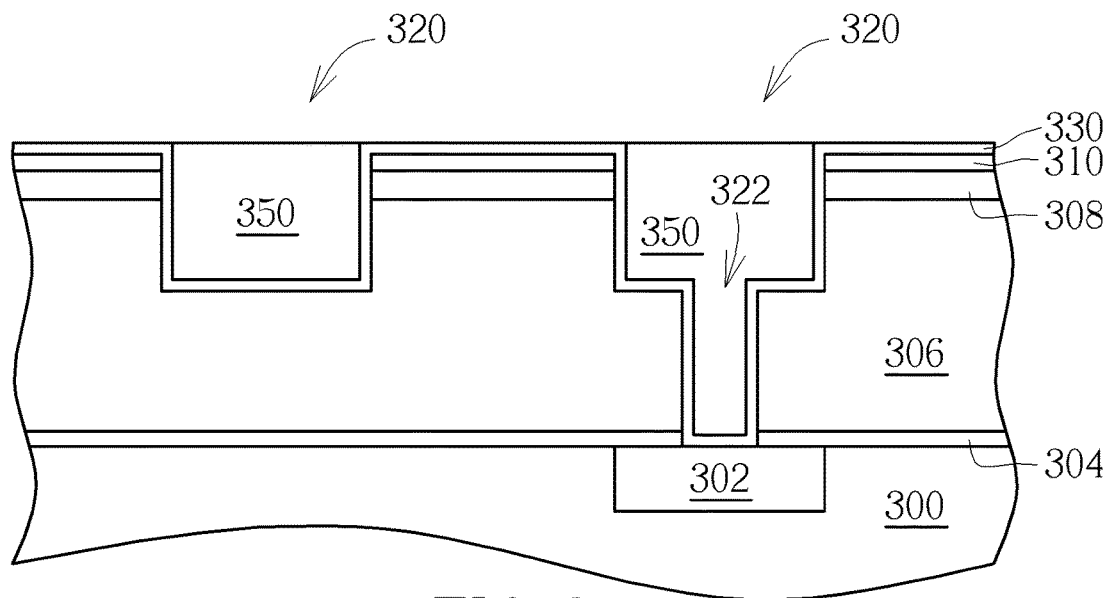
FIGS. 9-13 are schematic drawings illustrating a method for manufacturing metal interconnects provided by a third preferred embodiment of the present invention.

Please refer to FIG. 9-13, which are schematic drawings illustrating a method for manufacturing metal interconnects provided by a third preferred embodiment of the present invention. It should be noted that elements the same in the first, the second and the third preferred embodiments can include the same material and thus those details are omitted in the interest of brevity. As shown in FIG. 9, the preferred embodiment first provides a substrate 300. The substrate 300 includes a conductive layer 302 formed therein, and a base layer 304 is formed to cover the conductive layer 302. The substrate 300 further includes a dielectric layer 306 formed thereon. A cap layer 308 and a patterned metal hard mask 310 are formed on the dielectric layer 306 as shown in FIG. 9. In some embodiments of the preset invention, an ARC layer (not shown) is selectively formed on the patterned metal hard mask 310. A plurality of trenches 320 are formed in the dielectric layer 306. In some embodiments of the present invention, at least a via hole 322 is further formed in the dielectric layer 306 under one of the trenches 320 as shown in FIG. 9. Furthermore, the conductive layer 302 is exposed at a bottom of the via hole 322 as shown in FIG. 9.

Please still refer to FIG. 9. Next, the via hole 322 and the trenches 320 are lined with a diffusion barrier layer 330. That is, bottoms and sidewalls of the via hole 322 and of the trenches 320 are covered by the diffusion barrier layer 330. In some embodiments of the present invention, a thickness of the diffusion barrier layer 330 is between 20 Å and 200 Å, but not limited to this. After forming the diffusion barrier layer 330, a sacrificial layer 350 is respectively formed in the trenches 320 and the via hole 322 as shown in FIG. 9. In some embodiments of the present invention, the sacrificial layer 350 can be a photoresist, but not limited to this. It is noteworthy that, the trenches 320 and the via hole 322 are filled up with the sacrificial layer 350, and thus the diffusion barrier layer 330 on the sidewalls and the bottoms of the trenches 320 and the via hole 322 are covered by the sacrificial layer 350 while portions of the diffusion barrier layer 330 that are on the top surface of the dielectric layer 306 are exposed as shown in FIG. 9.

Figure 10:
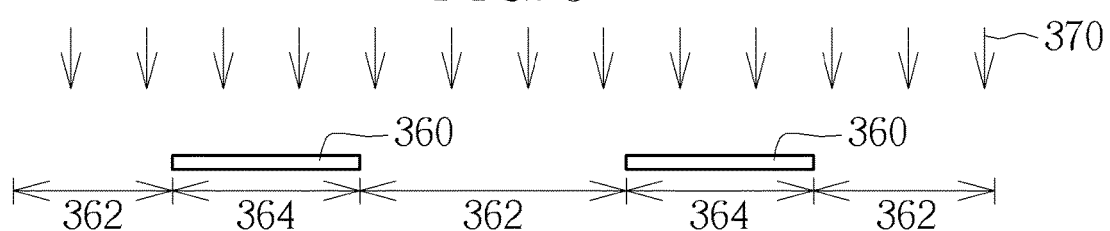
Figure 10:
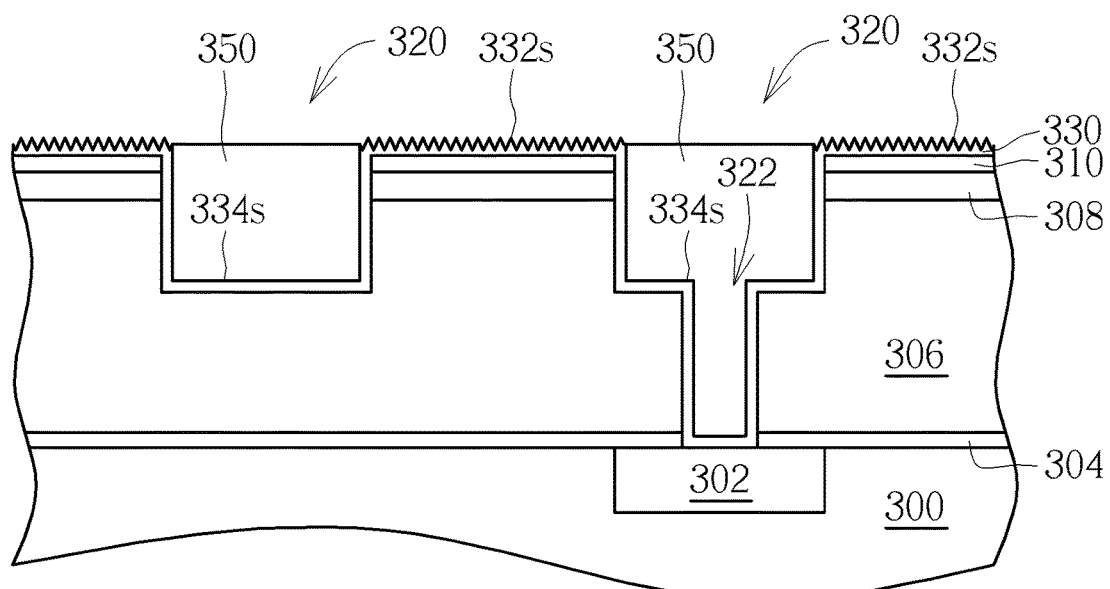

Please refer to FIG. 10. After forming the diffusion barrier layer 330 and the sacrificial layer 350, the substrate 300 is masked by, for example but not limited to, a mask 360. Accordingly, regions of the diffusion barrier layer 330 not being masked are defined as exposed regions 362 while regions being masked are defined as masked regions 364. Please still refer to FIG. 10. Next, a surface treatment 370 is performed to the exposed regions 362 of the diffusion barrier layer 330. In the preferred embodiment, the surface treatment 370 includes an ion bombardment, and the ion bombardment includes producing N, B, As, P, inert, or halogen ions. It is noteworthy that in some embodiments of the present invention, the ion bombardment provides N, B, As P, or inert ions with higher bias, compared with other embodiments of the present invention that the ion bombardment provides halogen ions with lower bias. It should be understood to those skilled in the art that the above mentioned higher and lower bias can be controlled by power source. For example but not limited to, the halogen ions are provided with a lower bias in a range from 10V to 100V while N, B, As P, or inert ions are provided with a higher bias larger than 100V.

More important, the surface treatment 370, that is the ion bombardment is performed to damage surfaces of the exposed region 362 of the diffusion barrier layer 330 and thus a plurality of rough surfaces 332s on the exposed regions 362 of the diffusion barrier layer 330 are obtained. It is noteworthy that the masked regions 364 of the diffusion barrier layer 330 are masked by the mask 360 and protected by the sacrificial layer 350 and thus no impact is rendered to the masked regions 364. Consequently, the masked regions 364 include respectively a smooth surface 334s compared with the rough surfaces 332s of the exposed regions 362.

Figure 11:
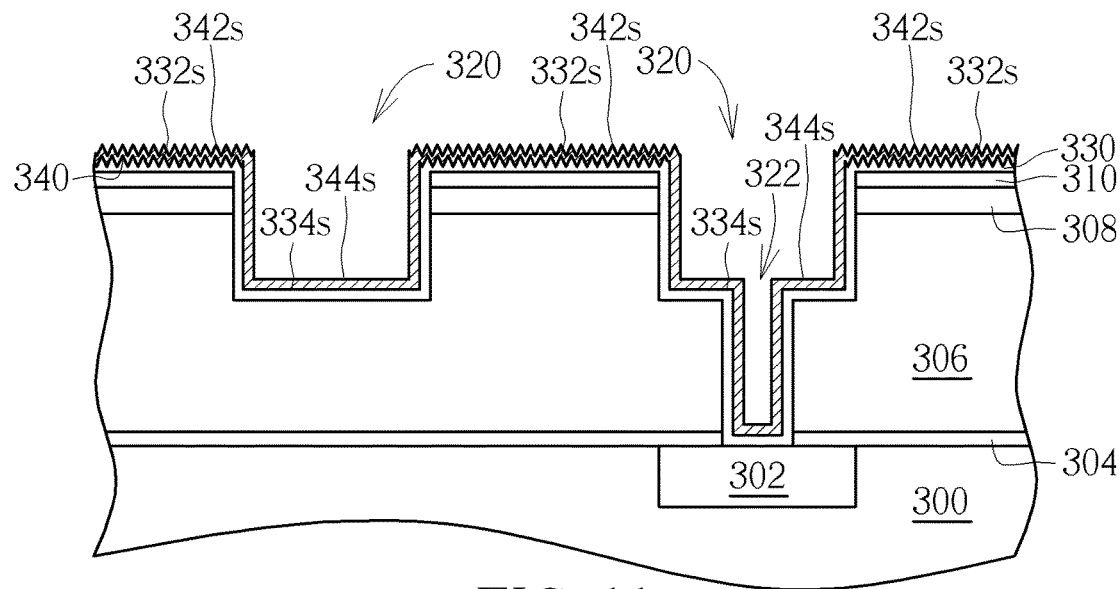

Please refer to FIG. 11. After forming the rough surfaces 332s, the mask 360 and the sacrificial layer 350 are removed. Subsequently, a seed layer 340, such as a Cu seed layer 340 is formed on the diffusion barrier layer 330 in the trenches 320 and the via hole 322. As shown in FIG. 11, trenches 320 and the via hole 322 are lined with the seed layer 340. A thickness of the seed layer 340 is between 170 Å and 200 Å, but not limited to this. It is noteworthy that the seed layer 340 formed on the rough surfaces 332s of the diffusion barrier layer 330 obtains a rough surface 342s while the seed layer 340 formed on the smooth surfaces 334s obtains a smooth surface 344s as shown in FIG. 11. Please refer to FIGS. 10 and 11 together in order to clearly describe the preferred embodiment. As shown in FIGS. 10 and 11, it is found that the rough surfaces 342s of the seed layer 340 are formed respectively on the exposed regions 362 that are correspondingly outside of the trenches 320.

Figure 12:
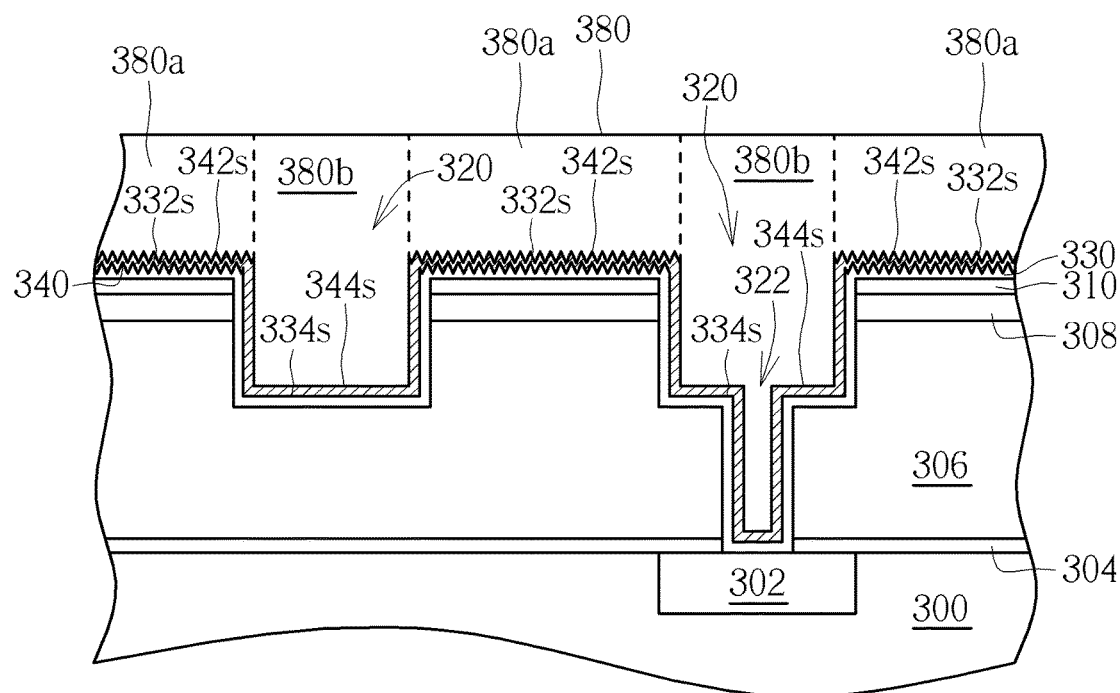

Please refer to FIG. 12. After forming the seed layer 340, a metal layer 380 such as a Cu layer 380 is then formed, and the trenches 320 and the via hole 322 are filled up with the Cu layer 380. It is well-known to those skilled in the art that the quality of the seed layer 340 greatly affects the quality of the Cu layer 380. Consequently, portions 380a of the Cu layer 380 formed on the rough surfaces 342s inherently obtain an inferior quality compared with the other portions 380b of the Cu layer 380 formed on the smooth surfaces 344s.

Figure 13:
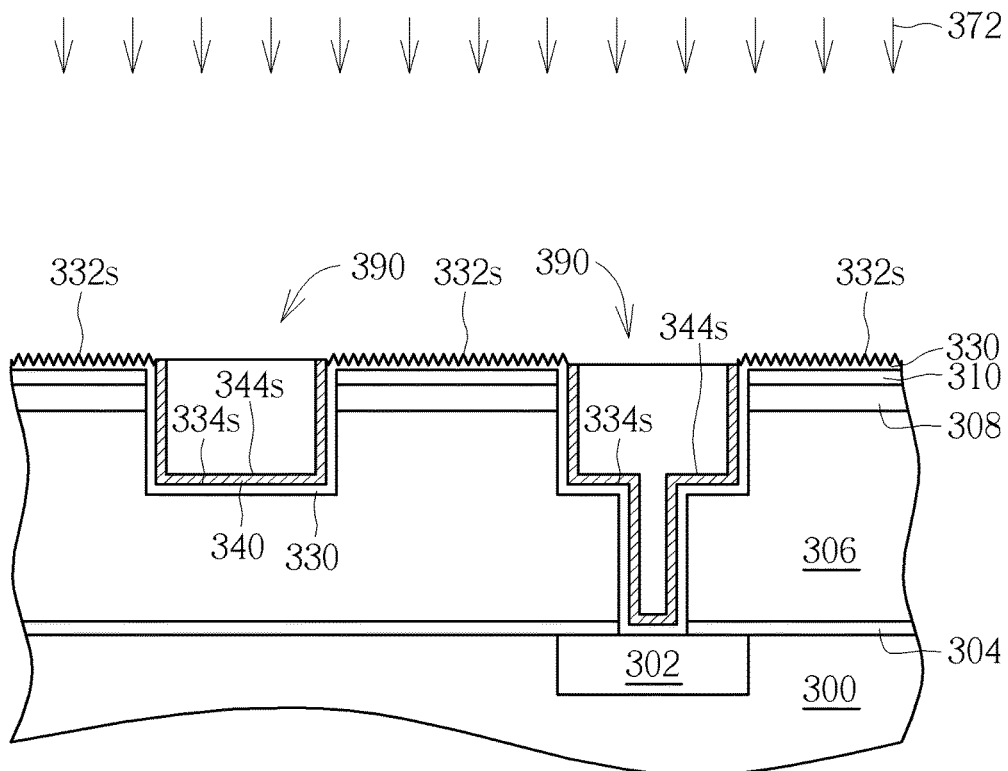

Please refer to FIG. 13. After filling the trenches 320 and the via hole 322 with the metal layer 380, a planarization process 372 is performed to remove superfluous metal layer 380 and seed layer 340 from the substrate 300 to forma plurality of metal interconnects 390 on the substrate 300. It is noteworthy that the planarization process 372 is performed to remove the superfluous metal layer 380 and seed layer 340 until the diffusion barrier layer 330 is exposed. As mentioned above, for exposing the diffusion barrier layer, dishing is always caused in top surfaces of the metal interconnects in the prior art. However, the metal layer 380 provided by the preferred embodiment includes the portions 380a having an inferior quality due to the rough surfaces 342s of the seed layer 340 on which it is formed. And removal of the portions 380a of the metal layer 380, which is formed correspondingly outside of the trenches 320, is facilitated due to its inferior quality. Thus, when the point is reached that all metal layer 380 outside the trenches 320 has been removed, the trenches 320 are found to be just filled with a flat layer that has no dishing as shown in FIG. 13. Additionally, those skilled in the art would easily realize that the diffusion barrier layer 330 exposed on patterned metal hard mask 310 is to be removed.

According to the method for manufacturing the metal interconnects provided by the preferred embodiment, the surface treatment 370 is performed before forming the seed layer 340. Therefore the seed layer 340 formed on the rough surfaces 332s of the diffusion barrier layer 330 obtains the rough surfaces 342s while the seed layer 340 formed on the smooth surfaces 334s of the diffusion barrier layer 330 obtains the smooth surfaces 344s. Consequently, the portions 380a of the metal layer 380 formed on the rough surfaces 342s, which are correspondingly defined outside of the trenches 320, inherently obtain the inferior quality and thus are more easily to be removed. As mentioned above, when the point is reached that the metal layer 380 outside the trenches 320 has been removed, the trenches 320 are found to be just filled with a flat layer and the resulted metal interconnects 390 have no dishing issue.

Figure 14:
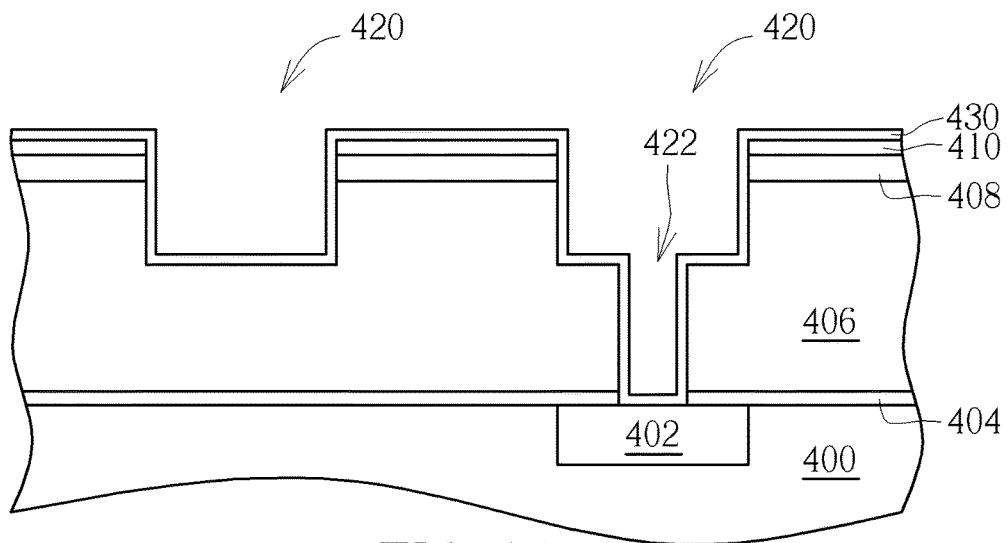
FIGS. 14-17 are schematic drawings illustrating a method for manufacturing metal interconnects provided by a fourth preferred embodiment of the present invention.

Please refer to FIG. 14-17, which are schematic drawings illustrating a method for manufacturing metal interconnects provided by a fourth preferred embodiment of the present invention. It should be noted that elements the same in the aforementioned embodiments and the fourth embodiment can include the same material and thus those details are omitted in the interest of brevity. As shown in FIG. 14, the preferred embodiment first provides a substrate 400. The substrate 400 includes a conductive layer 402 formed therein, and a base layer 404 is formed to cover the conductive layer 402. The substrate 400 further includes a dielectric layer 406 formed thereon. A cap layer 408 and a patterned metal hard mask 410 are formed on the dielectric layer 306 as shown in FIG. 14. In some embodiments of the preset invention, an ARC layer (not shown) is selectively formed on the patterned metal hard mask 410. A plurality of trenches 420 are formed in the dielectric layer 406. In some embodiments of the present invention, at least a via hole 422 is further formed in the dielectric layer 406 under one of the trenches 420 as shown in FIG. 14. Furthermore, the conductive layer 402 is exposed at a bottom of the via hole 422 as shown in FIG. 14. Please still refer to FIG. 14. Next, the via hole 422 and the trenches 420 are lined with a diffusion barrier layer 430. That is, bottoms and sidewalls of the via hole 422 and of the trenches 420 are covered by the diffusion barrier layer 430. In some embodiments of the present invention, a thickness of the diffusion barrier layer 430 is between 20 Å and 200 Å, but not limited to this.

Figure 15:
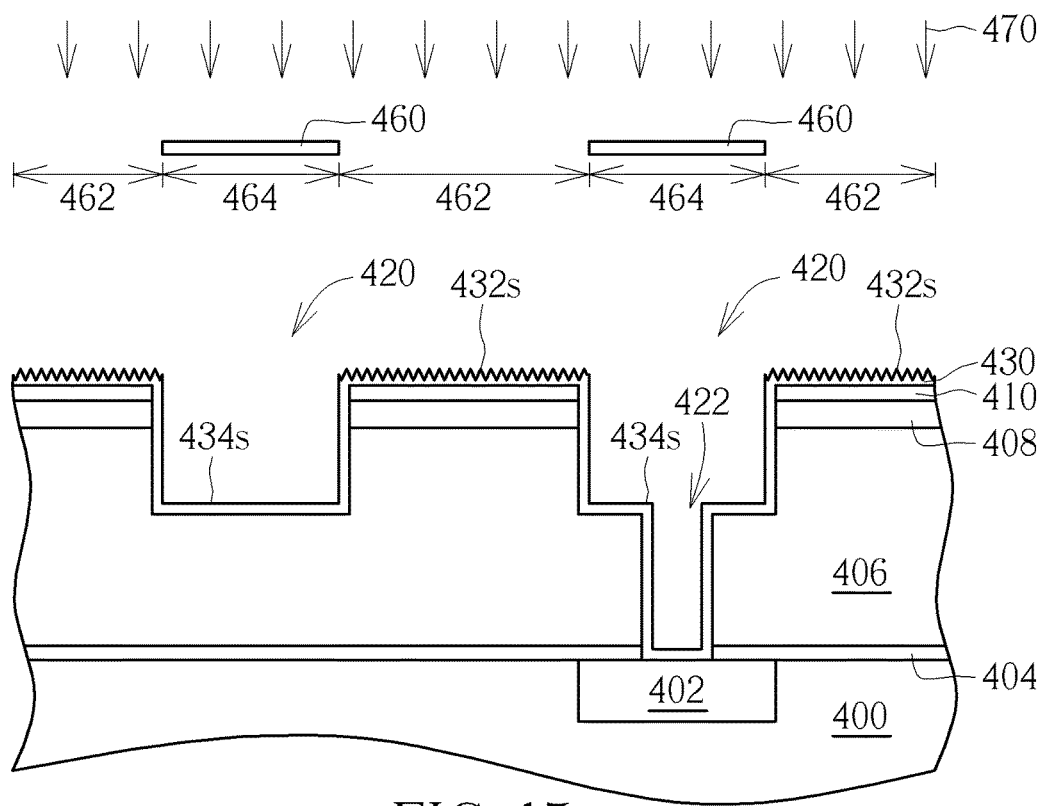

Please refer to FIG. 15. After forming the diffusion barrier layer 430, the substrate 400 is masked by, for example but not limited to, a photomask 460. Accordingly, regions of the diffusion barrier layer 430 not being masked are defined as exposed region 462 while regions being masked are defined as masked regions 464. Please still refer to FIG. 15. Next, a surface treatment 470 is performed to the exposed regions 462 of the diffusion barrier layer 430. In the preferred embodiment, the surface treatment 470 includes an exposure, and the exposure includes Laser or UV. In other words, the substrate 400 is exposed to Laser or UV with the photomask 460 intervening between the light source and the substrate 400.

More important, the exposed regions 462 are exposed to Laser or UV and thus galvanic corrosion is caused. Consequently, surfaces of the exposed regions 462 are damaged, and thus a plurality of rough surfaces 432s on the exposed regions 462 of the diffusion barrier layer 430 are obtained. It is noteworthy that the masked regions 464 of the diffusion barrier layer 430 are masked by the photomask 460 and thus protected from the surface treatment 470. Consequently, no impact is rendered to the masked regions 464. As a result, the masked regions 464 respectively include a smooth surface 434s compared with the rough surfaces 432s of the exposed regions 462.

Figure 16:
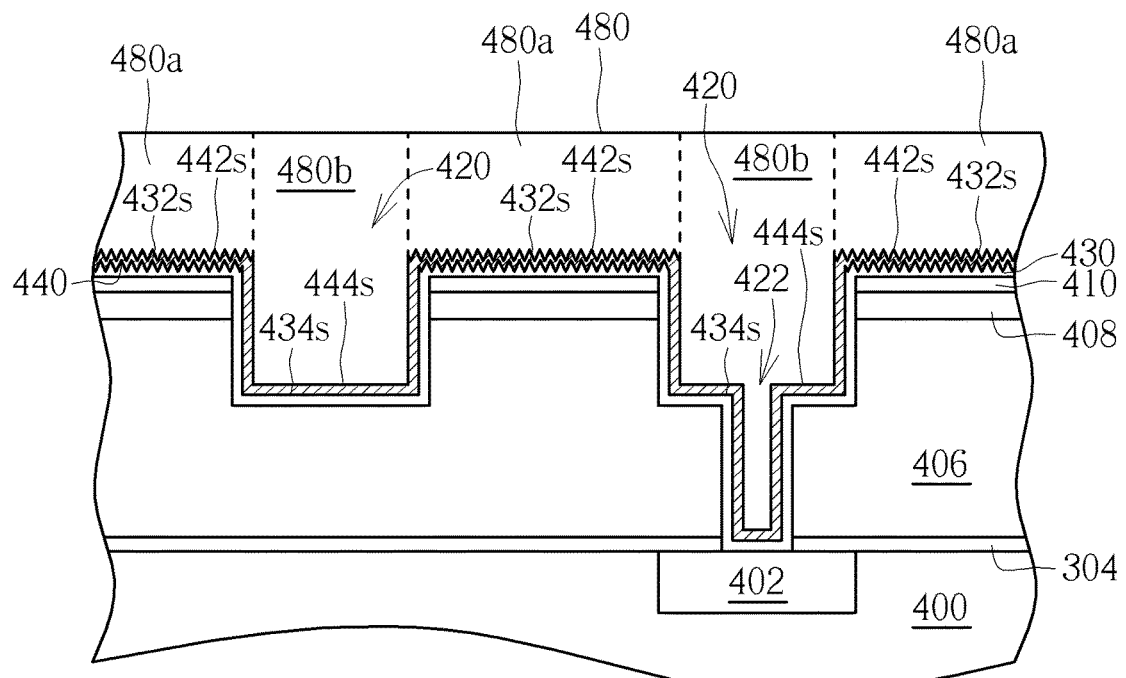

Please refer to FIG. 16. After forming the rough surfaces 432s, the photomask 460 is removed. Subsequently, a seed layer 440, such as a Cu seed layer 440 is formed on the diffusion barrier layer 430 in the trenches 420 and the via hole 422. As shown in FIG. 16, the trenches 420 and the via hole 422 are lined with the seed layer 440. A thickness of the seed layer 440 is between 170 Å and 200 Å, but not limited to this. It is noteworthy that the seed layer 440 formed on the rough surfaces 432s of the diffusion barrier layer 430 obtains a rough surface 442s while the seed layer 440 formed on the smooth surfaces 434s obtains a smooth surface 444s as shown in FIG. 16. Please refer to FIGS. 15 and 16 together in order to clearly describe the preferred embodiment. As shown in FIGS. 15 and 16, it is found that the rough surfaces 442s of the seed layer 440 are formed respectively on the exposed regions 462 that are correspondingly outside of the trenches 420.

Please still refer to FIG. 16. After forming the seed layer 440, a metal layer 480 such as a Cu layer 480 is then formed, and the trenches 420 and the via hole 422 are filled up with the Cu layer 480. It is well-known to those skilled in the art that the quality of the seed layer 440 greatly affects the quality of the Cu layer 480. Consequently, portions 480a of the Cu layer 480 formed on the rough surfaces 442s inherently obtain an inferior quality compared with the other portions 480b of the Cu layer 480 formed on the smooth surfaces 444s.

Figure 17:
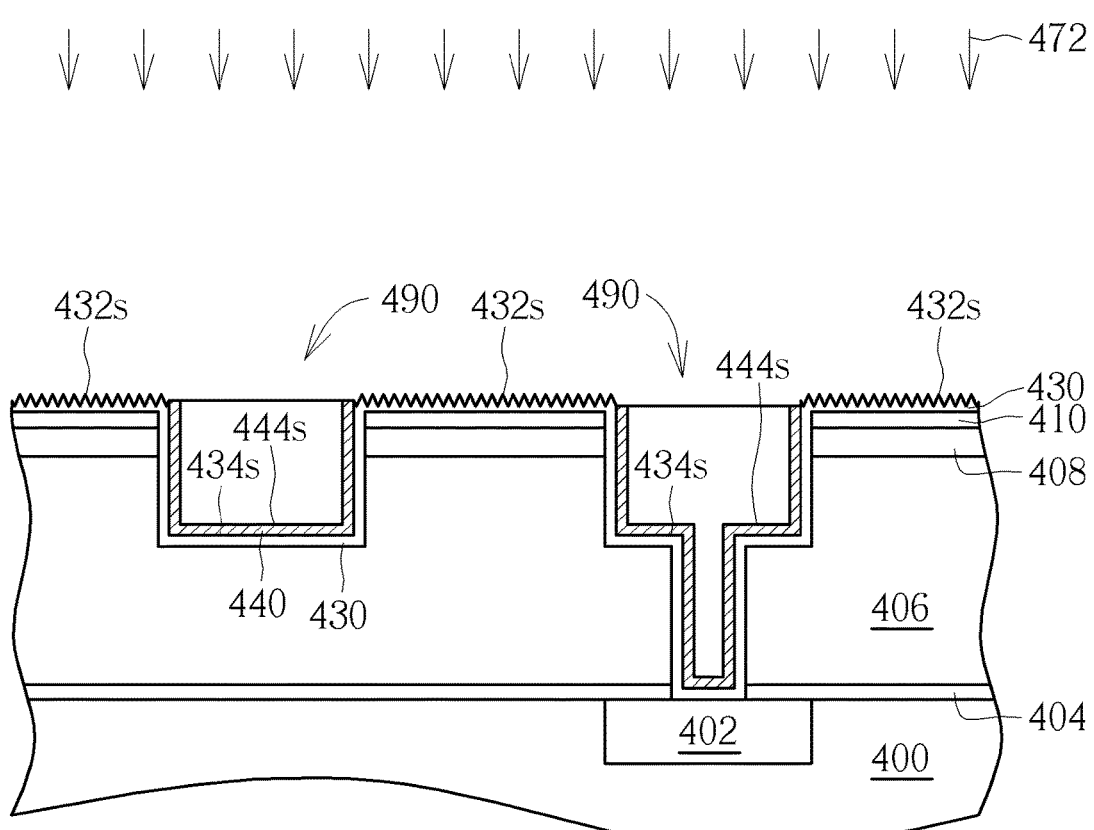

Please refer to FIG. 17. After filling the trenches 420 and the via hole 422 with the metal layer 480, a planarization process 472 is performed to remove superfluous metal layer 480 and seed layer 440 from the substrate 400 to forma plurality of metal interconnects 490 on the substrate 400. It is noteworthy that the planarization process 472 is performed to remove the superfluous metal layer 480 and seed layer 440 until the diffusion barrier layer 430 is exposed. As mentioned above, for exposing the diffusion barrier layer, dishing is always caused in top surfaces of the metal interconnects in the prior art. However, the metal layer 480 provided by the preferred embodiment includes the portions 480a having an inferior quality due to the rough surfaces 442s of the seed layer 440 on which it is formed. And removal of the portions 480a of the metal layer 480, which are formed correspondingly outside of the trenches 420, is facilitated due to its inferior quality. Thus, when the point is reached that all metal layer 480 outside the trenches 420 has been removed, the trenches 420 are found to be just filled with a flat layer that has no dishing as shown in FIG. 17. Additionally, those skilled in the art would easily realize that the diffusion barrier layer 430 exposed on patterned metal hard mask 410 is to be removed.

According to the method for manufacturing the metal interconnects provided by the preferred embodiment, the surface treatment 470 is performed before forming the seed layer 440 without requiring any sacrificial layer. Therefore the seed layer 440 formed on the rough surfaces 432s of the diffusion barrier layer 430 obtains the rough surfaces 442s while the seed layer 440 formed on the smooth surfaces 434s of the diffusion barrier layer 430 obtains the smooth surfaces 444s. Consequently, the portions 480a of the metal layer 480 formed on the rough surfaces 442s, which are correspondingly defined outside of the trenches 420, inherently obtain the inferior quality and thus are more easily to be removed. As mentioned above, when the point is reached that the metal layer 480 outside the trenches 420 has been removed, the trenches 420 are found to be just filled with a flat layer and the resulted metal interconnects 490 have no dishing issue.

According to the methods for manufacturing the metal interconnects provided by the present invention, the surface treatment is performed before or after forming the seed layer such that the seed layer obtains rough surfaces on certain regions that are defined outside of the trenches. And the surface treatment can include ion bombardment or exposure. More important, the portions of the metal layer formed on the rough surfaces of the seed layer inherently obtain inferior quality. Accordingly, removal of those portions of the metal layer is facilitated. Thus, when the point is reached that all conductive material outside the trenches has been removed, the trenches are found to be just filled with a flat layer that has no dishing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing metal interconnects, comprising:
    providing a substrate comprising a dielectric layer formed thereon, and a plurality of trenches being formed in the dielectric layer;
    forming a seed layer in the trenches and on the dielectric layer;
    masking regions of the seed layer to define a plurality of masked regions correspondingly to the trenches and a plurality of exposed regions for the seed layer;
    performing a surface treatment to the exposed regions of the seed layer to form a plurality of rough surfaces on the exposed regions of the seed layer; and
    forming a metal layer on the substrate, and the trenches being filled up with the metal layer.

2. The method for manufacturing the metal interconnects according to claim 1, further comprising forming a sacrificial layer respectively in the trenches before masking the regions of the seed layer.

3. The method for manufacturing the metal interconnects according to claim 2, wherein the surface treatment comprises an ion bombardment.

4. The method for manufacturing the metal interconnects according to claim 3, wherein the ion bombardment comprises producing nitrogen (N), boron (B), arsenic (As), phosphorous (P), inert, or halogen ions.

5. The method for manufacturing the metal interconnects according to claim 4, wherein the ion bombardment comprises providing halogen ions with lower bias.

6. The method for manufacturing the metal interconnects according to claim 1, wherein the surface treatment comprises exposure.

7. The method for manufacturing the metal interconnects according to claim 6, wherein the exposure comprises Laser or UV.

8. The method for manufacturing the metal interconnects according to claim 1, further comprising at least a via hole formed under one of the plurality of trenches.

9. The method for manufacturing the metal interconnects according to claim 1, further comprising a diffusion barrier layer formed under the seed layer.

10. The method for manufacturing the metal interconnects according to claim 1, further comprising performing a planarization process to remove superfluous metal layer from the substrate to form a plurality of metal interconnects on the substrate.

11. A method for manufacturing metal interconnects, comprising:
    providing a substrate comprising a dielectric layer formed thereon, and a plurality of trenches being formed in the dielectric layer;
    masking the trenches to define a plurality of exposed regions on the dielectric layer;
    performing a surface treatment to the exposed regions to form a plurality of rough surfaces on the exposed regions;
    forming a seed layer on the substrate after the surface treatment, the seed layer comprising a plurality of rough surfaces respectively on the exposed regions; and
    forming a metal layer on the substrate, and the trenches being filled up with the metal layer.

12. The method for manufacturing the metal interconnects according to claim 11, further comprising forming a sacrificial layer respectively in the trenches before masking the trenches.

13. The method for manufacturing the metal interconnects according to claim 12, wherein the surface treatment comprises an ion bombardment.

14. The method for manufacturing the metal interconnects according to claim 13, wherein the ion bombardment comprises producing N, B, As, P, inert, or halogen ions.

15. The method for manufacturing the metal interconnects according to claim 14, wherein the ion bombardment comprises providing halogen ions with lower energy.

16. The method for manufacturing the metal interconnects according to claim 11, wherein the surface treatment comprises exposure to Laser or UV.

17. The method for manufacturing the metal interconnects according to claim 11, further comprising at least a via hole formed under one of the plurality of trenches.

18. The method for manufacturing the metal interconnects according to claim 11, further comprising a diffusion barrier layer formed under the seed layer.

19. The method for manufacturing the metal interconnects according to claim 18, wherein the diffusion barrier layer comprises the rough surfaces.

20. The method for manufacturing the metal interconnects according to claim 11, further comprising performing a planarization process to remove superfluous metal layer from the substrate to form a plurality of metal interconnects on the substrate.

* * * * *